US012754220B2

(12) United States Patent
Leonard et al.

(10) Patent No.: US 12,754,220 B2
(45) Date of Patent: Oct. 6, 2026

(54) POWER METER DETERMINING AN OPERATING STATE

(71) Applicant: Senva Inc., Beaverton, OR (US)

(72) Inventors: Scott Leonard, Portland, OR (US); Dalton Paull, Scappoose, OR (US); Kent Holce, Portland, OR (US); Andre Perra, Portland, OR (US)

(73) Assignee: Senva Inc., Beaverton, OR (US)

( * ) Notice: Subject to any disclaimer, the term of this patent is extended or adjusted under 35 U.S.C. 154(b) by 439 days.

(21) Appl. No.: 18/361,323

(22) Filed: Jul. 28, 2023

(65) Prior Publication Data

US 2025/0035682 A1 Jan. 30, 2025

(51) Int. Cl.
*G01R 21/00* (2006.01)
*G01R 19/02* (2006.01)
*G01R 21/133* (2006.01)

(52) U.S. Cl.
CPC ........... *G01R 21/006* (2013.01); *G01R 19/02* (2013.01); *G01R 21/133* (2013.01)

(58) Field of Classification Search
CPC .... G01R 19/02; G01R 21/006; G01R 21/133; G01R 21/06; G01R 31/343
USPC ........................................................... 702/60
See application file for complete search history.

(56) References Cited

U.S. PATENT DOCUMENTS 8,930,152 B2 1/2015 Patel et al.
9,063,184 B2 6/2015 Carpenter et al.
9,081,043 B2 7/2015 Park et al.
9,535,097 B2 1/2017 Davis et al.
9,726,700 B2 8/2017 Shamir
9,778,285 B2 10/2017 Fox
9,829,516 B1 11/2017 Ernst
9,915,689 B2 3/2018 Matsuura et al.
10,352,967 B2 7/2019 Steuer et al.
11,112,433 B2 9/2021 Worones et al.
2014/0266755 A1* 9/2014 Arensmeier ............. F24F 11/49 340/679
2015/0088441 A1* 3/2015 Nakata ............... G01R 21/1331 702/61

(Continued)

FOREIGN PATENT DOCUMENTS

CN 2304127 Y 1/1999
CN 111551779 A 8/2020
EP 3153869 B1 12/2019

OTHER PUBLICATIONS

EXTECH Instruments Product Datasheet, www.extech.com, Copyright 2007-2008, 1 page.

(Continued)

*Primary Examiner* — Andrew Schechter
*Assistant Examiner* — Joshua L Forristall
(74) *Attorney, Agent, or Firm* — Barley Snyder

(57) ABSTRACT

A power meter includes a current sensor sensing a current of a conductor signal transmitted along a conductor and outputting a current signal based on the current, a voltage sensor sensing a voltage of the conductor signal and outputting a voltage signal based on the voltage, and a controller receiving the current signal and the voltage signal and calculating a power factor of the conductor signal based on the current signal and the voltage signal. The controller determines an operating state of a powered device to which the conductor feeds the conductor signal based on the power factor.

19 Claims, 7 Drawing Sheets

(56) References Cited

U.S. PATENT DOCUMENTS

| | | | | |
|---|---|---|---|---|
| 2016/0061862 | A1* | 3/2016 | Nulty ................... | G01R 15/142 324/127 |
| 2016/0327598 | A1* | 11/2016 | Seo ...................... | G01R 21/133 |
| 2017/0242059 | A1* | 8/2017 | Parker .................. | G01R 21/006 |
| 2017/0336447 | A1 | 11/2017 | Valenti et al. | |
| 2021/0080514 | A1* | 3/2021 | Beaudet ................. | G08B 17/00 |
| 2022/0178971 | A1 | 6/2022 | Dutta et al. | |

OTHER PUBLICATIONS

Greenlee, Distributed by: Valuetesters.com, 1 page.

International Journal on Advances in Networks and Services, vol. 15 No. 1 & 2, year 2022, http://www.iariajournals.org/networks_and_services/, 43 pages.

* cited by examiner

POWER METER DETERMINING AN OPERATING STATE

FIELD OF THE INVENTION

The present invention relates to a sensor and, more particularly, to a power meter disposed on a conductor and determining an operating state of a powered device to which the conductor is connected.

BACKGROUND

To determine the operating state of a powered device, such as a motor, a sensor is attached to the conductor that provides power to the motor. The sensor commonly has a current transformer that determines a current of a conductor signal transmitted along the conductor to the motor. A controller of the sensor compares the current to a threshold to determine whether the motor is running or not running.

In many motors and other powered devices, however, the current of the conductor signal is similar and only differs slightly between the off state and running state of the motor; the determination of the operating state from the current is thus prone to error. The threshold used to determine the operating state is also often pre-set or manually adjustable only in certain large increments and therefore may not be accurate in some applications, leading to further difficulties in reliably determining the operating state of the motor using the sensor disposed on the conductor.

SUMMARY

A power meter includes a current sensor sensing a current of a conductor signal transmitted along a conductor and outputting a current signal based on the current, a voltage sensor sensing a voltage of the conductor signal and outputting a voltage signal based on the voltage, and a controller receiving the current signal and the voltage signal and calculating a power factor of the conductor signal based on the current signal and the voltage signal. The controller determines an operating state of a powered device to which the conductor feeds the conductor signal based on the power factor.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
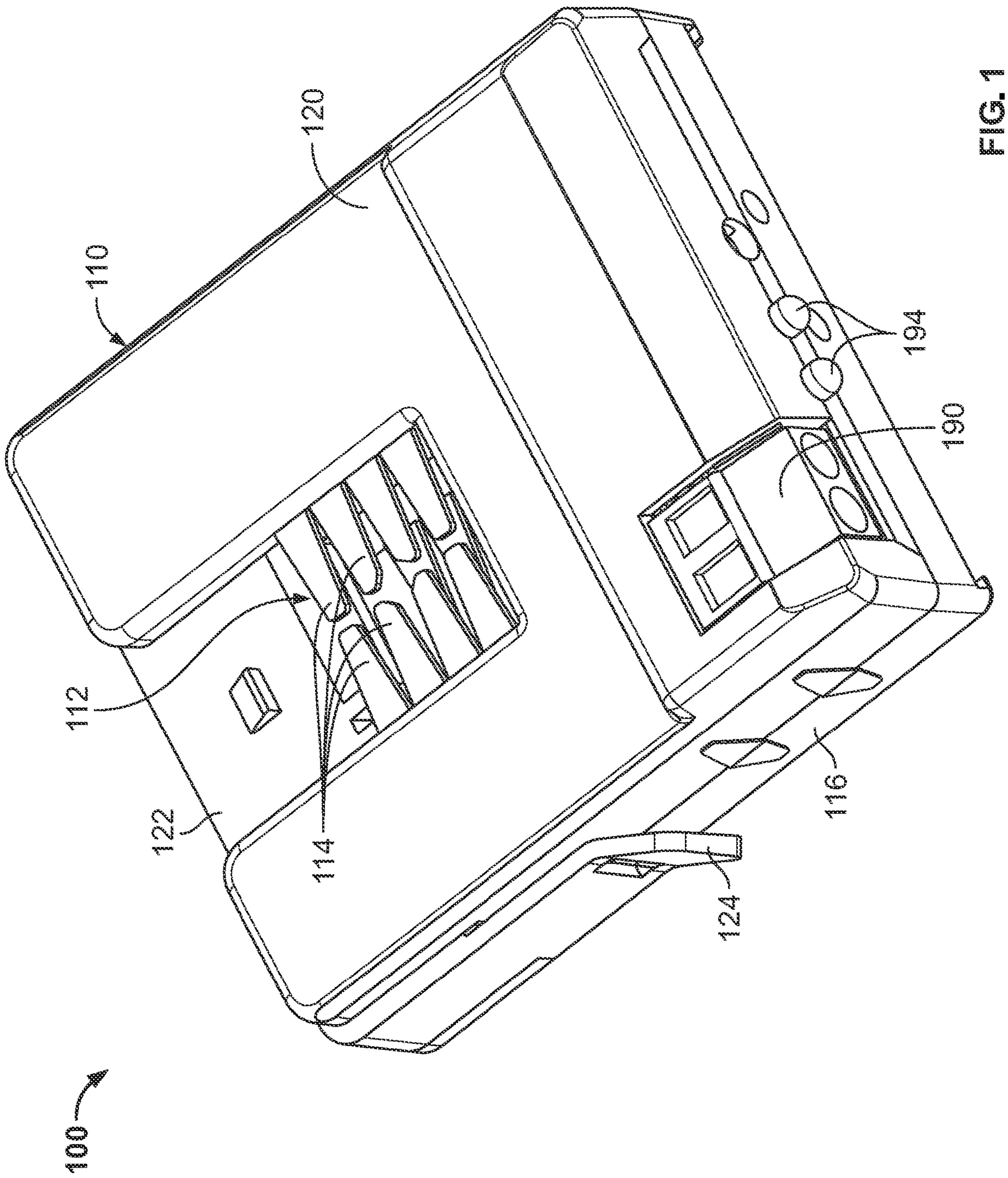
FIG. 1 is a perspective view of a power meter according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art. In addition, in the following detailed description, for purposes of explanation, numerous specific details are set forth to provide a thorough understanding of the disclosed embodiments. However, it is apparent that one or more embodiments may also be implemented without these specific details. Throughout the drawings, only one of a plurality of identical elements may be labeled in a figure for clarity of the drawings, but the detailed description of the element herein applies equally to each of the identically appearing elements in the figure.

Figure 2:
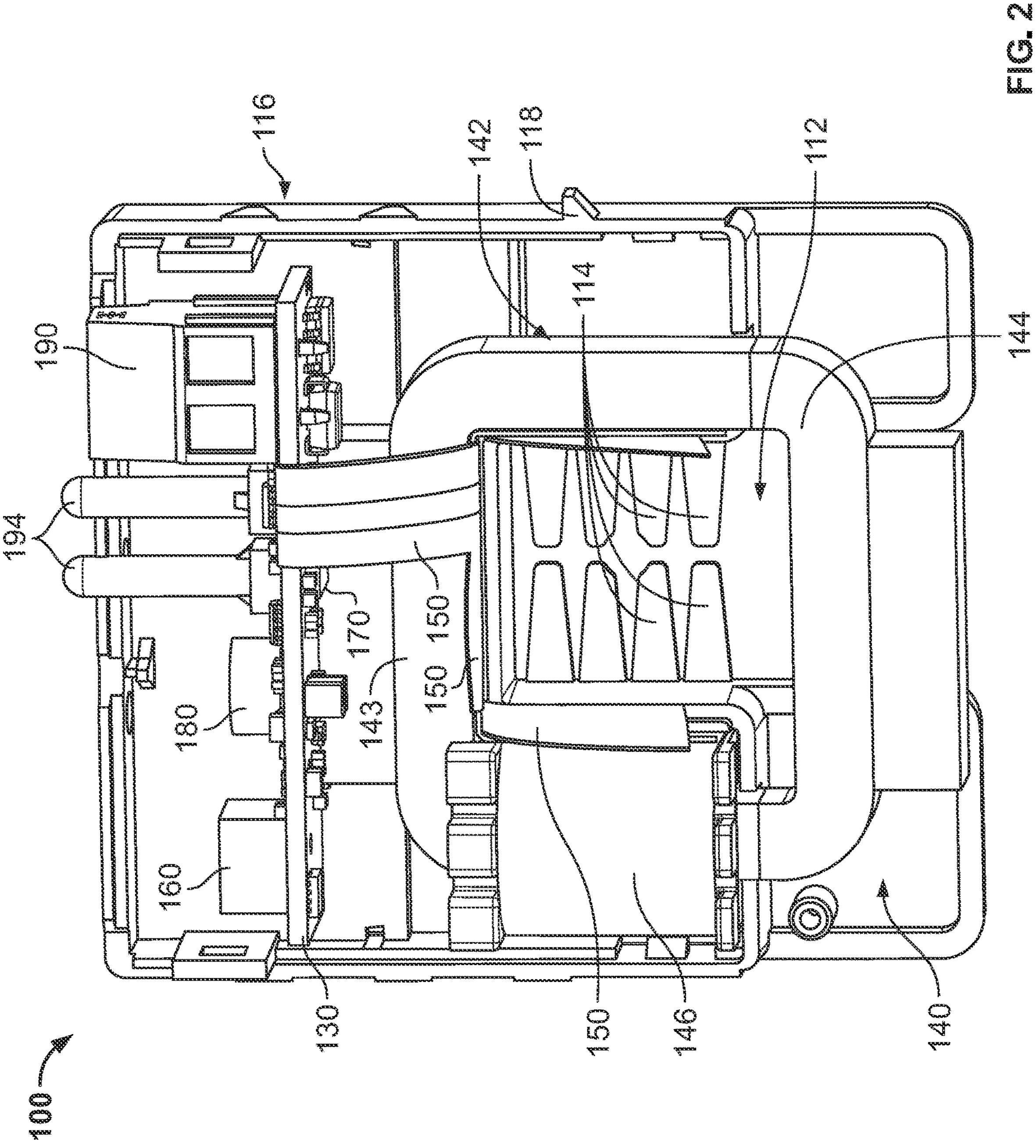
FIG. 2 is a perspective view of the power meter with a portion of a housing removed.

A power meter 100 according to an embodiment is shown in FIGS. 1 and 2. The power meter 100 includes a housing 110, a printed circuit board (PCB) 130 disposed in the housing 110, a pair of sensors 140, 150 disposed in the housing 110, a communication interface 160, an external connection device 190, a controller 170 connected to the communication interface 160 and the external connection device 190, a capacitor 180, and a plurality of indicators 194.

The housing 110, as shown in FIGS. 1 and 2, has a wire receiving opening 112 extending through the housing 110. The housing 110, in the shown embodiment, is formed of a first portion 116 and a second portion 120 that are attached together around a hinged section 122. The first portion 116 and the second portion 120 each define a part of the wire receiving opening 112 and each have a plurality of fingers 114 extending over the wire receiving opening 112. The fingers 114 are each resiliently deformable. The housing 110 is formed from a plastic material, such as nylon or acrylonitrile butadiene styrene (ABS). In the shown embodiment, each of the first portion 116 and the second portion 120, including the fingers 114, is monolithically formed in a single piece from the plastic material of the housing 110.

The hinged section 122 positioned between the first portion 116 and the second portion 120 is rotatable with respect to the first portion 116 and the second portion 120 between an open position and a closed position shown in FIG. 1. In the shown embodiment, the first portion 116 has a protrusion 118 extending from a side and the hinged section 112 has a latch 124 that engages with the protrusion 118 to releasably secure the hinged section 112 in the closed position. In other embodiments, the hinged section 122 may be secured in the closed position by any type of mechanical securing or fastening elements.

Figure 3:
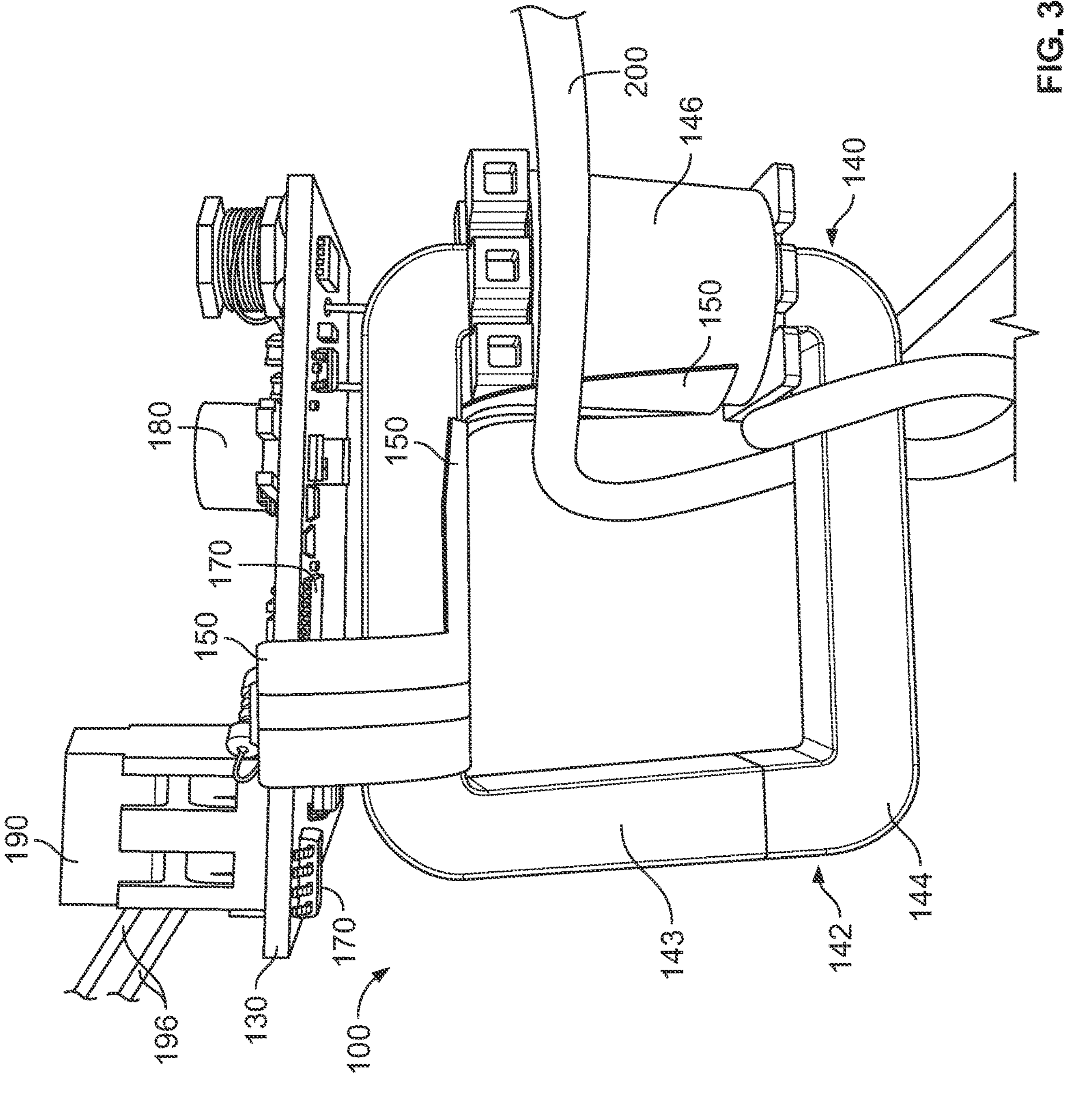
FIG. 3 is a perspective view of the power meter with the housing removed and a wire.
Figure 4:
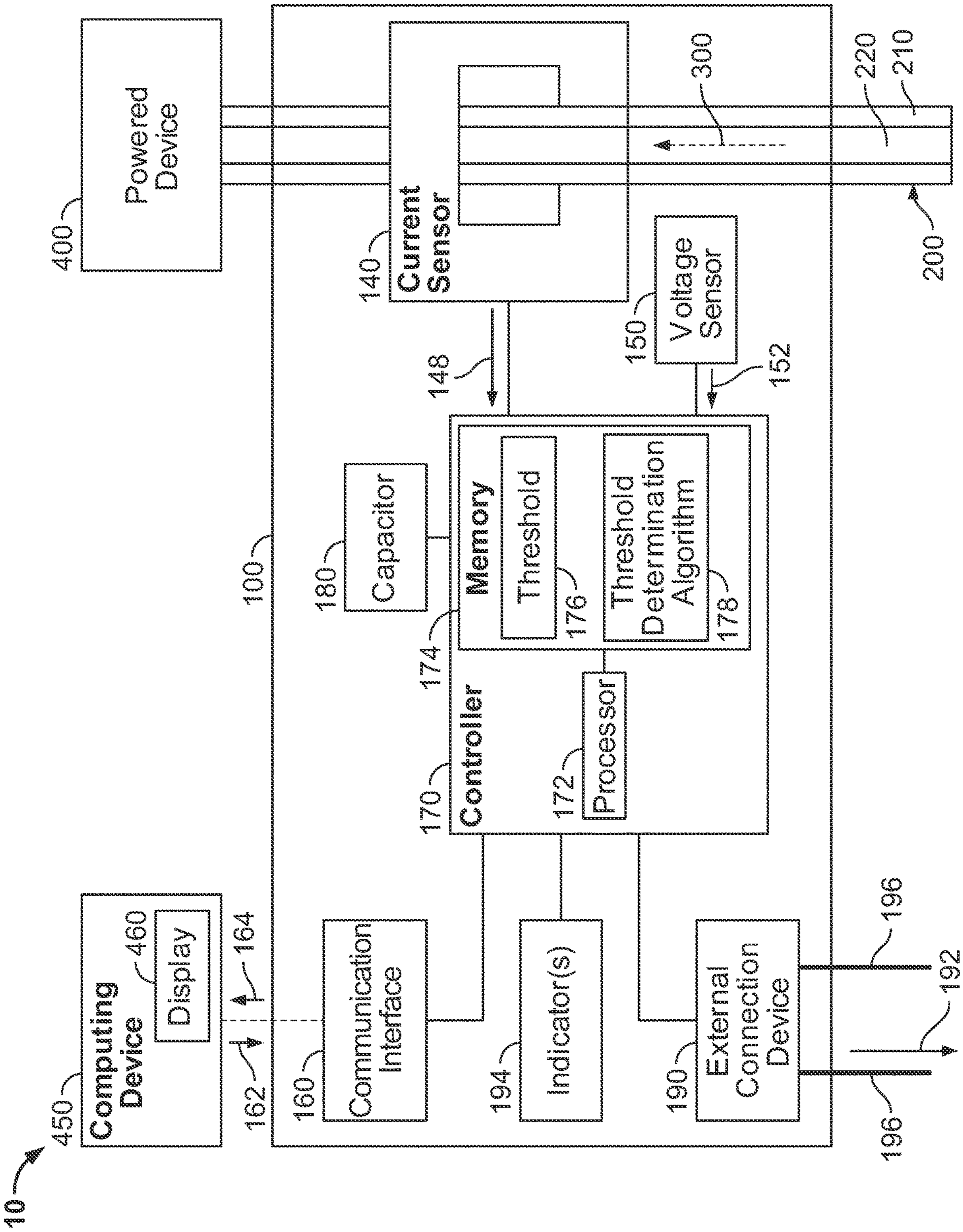
FIG. 4 is a block diagram of a sensor assembly according to an embodiment.

The PCB 130 as shown in FIGS. 2 and 3, may be any type of PCB that can accommodate and connect the components described below. As shown in FIGS. 2 and 3, the sensors 140, 150, the communication interface 160, the controller 170, the capacitor 180, the external connection device 190, and the indicators 194 are positioned on the PCB 130. The PCB 130 electrically connects the sensors 140, 150, the communication interface 160, the controller 170, the capacitor 180, the external connection device 190, and the indicators 194; a block diagram schematically indicating the connections between the sensors 140, 150, the communication interface 160, the controller 170, the capacitor 180, the external connection device 190, and the indicators 194 is shown in FIG. 4 and will be described in greater detail below.

The sensors 140, 150 include a current sensor 140 and a voltage sensor 150. The voltage sensor 150, shown in FIGS.

2-4, may be any type of sensor that can contactlessly sense a voltage, such as a voltage electrode that senses a voltage by capacitance, and output a voltage signal 152 representative of the sensed voltage.

As shown in FIGS. 2 and 3, the current sensor 140 has a core 142 and a coil 146 wound around a portion of the core 142. The core 142 is formed of a magnetic, iron material and the coil 146 is formed of a conductive material, such as copper. The core 142 produces a magnetic flux that depends on the current of a conductor extending through the core 142. The magnetic flux produces a proportional current in the coil 146, which can be output as a current signal 148 to represent the current of the conductor extending through the core 142.

In the shown embodiment, the core 142 has a first section 143 and a second section 144 that is detached from the first section 143 and is movable with respect to the first section 143. The second section 144 is disposed in the hinged section 122 and, in the closed position of the hinged section 122, the second section 144 of the core 142 abuts the first section 143 of the core 142 as shown in FIGS. 2 and 3.

The communication interface 160, shown in FIGS. 2 and 4, is disposed on the PCB 130 and may be any device capable of wirelessly exchanging data in a near field proximity, such as a Bluetooth or a Zigbee device, or may be any device capable of wirelessly exchanging data over a broader range, such as a wifi device The capacitor 180, shown in FIGS. 2-4, is disposed on the PCB 130 and connected to the current sensor 140. The capacitor 180 may be any type of capacitor 180 that can store a charge received from the current sensor 140.

The external connection device 190, shown in FIGS. 1-4, is disposed on the PCB 130 and may be any device capable of outputting an analog signal or a digital signal. The external connection device 190 is exposed outside of the housing 110 may be connectable to at least one external signal wire 196 for outputting the analog or digital signal. In another embodiment, the external connection device 190 can output a signal by a solid state or electromechanical dry contact relay closure. The external connection device 190 may additionally be connectable to an external power wire 196 and may receive power from the external power wire 196. In various embodiments, the external connection device 190 may operate under a 2-wire data and power communication protocol, such as the KNX communication protocol, may operate under the RS-485 communication protocol, may operate under a 3-wire digital output protocol, or may operate under a 2-wire loop powered or 3-wire analog communication protocol. In other embodiments, a loop circuit is controllable to vary an analog output signal at the external connection device 190 from 4-20 mA. In another embodiment, the external connection device 190 may be capable of exchanging the output signal wirelessly, such as by WiFi, Bluetooth, or Zigbee. In another embodiment, the external connection device 190 may be a wired Ethernet interface that may include a Power over Ethernet (POE) capability.

The indicators 194, as shown in FIGS. 1 and 2, are disposed on the PCB 130 and extend away from the PCB 130 and through the housing 110. The indicators 194 are visible from outside the housing 110. In an embodiment, the indicators 194 are each a light emitting diode (LED) that is controllable to emit a selected color. In other embodiments, the indicators 194 can be any type of device that can be controlled to change an indication to an area outside of the housing 110, including an electrophoretic display, an LED having only binary color output, or other low power display elements.

As shown in FIGS. 2 and 3, the controller 170 is disposed on the PCB 130 and, as shown in FIG. 4, has a processor 172 and a memory 174 connected to the processor 172. The memory 174 is a non-transitory computer readable medium storing a plurality of computer-readable instructions that, when executed by the processor 172, perform the functions of the controller 170 described herein. The memory 174 additionally stores a plurality of thresholds 176 and a threshold determination algorithm 178 described in greater detail below. The controller 170, as shown in FIG. 4, is connected to the current sensor 140, the voltage sensor 150, the communication interface 160, the capacitor 180, the external connection device 190, and the indicators 194.

A sensor assembly 10 according to an embodiment is shown in FIG. 4 and includes the power meter 100, a wire 200, a powered device 400, and a computing device 450. The wire 200 is connected to the powered device 400 and supplies a conductor signal 300 to the powered device 400 to provide power to the powered device 400. The wire 200 has an insulation 210 disposed around a conductor 220; the conductor signal 300 is transmitted along the conductor 220. In various embodiments, the powered device 400 may be a constant volume fan or pump, a VFD fan or pump, or an electronically commutated motor (ECM). These exemplary applications are not limiting, however, and the power meter 100 can be used as described herein with wires 200 attached to any other type of powered device 400 that receives power from the conductor signal 300 transmitted along the wire 200.

As shown in FIGS. 3 and 4, the power meter 100 is positioned with the wire 200 extending through the core 142 of the current sensor 140. The housing 110 of the power meter 100 is omitted in FIG. 3 for clarity of the internal components of the power meter 100 but, in the embodiment shown in FIGS. 1 and 2, the wire 200 can extend through the wire receiving opening 112 of the housing 110 and can be held in place by the fingers 114 of the housing 110.

Figure 5A:
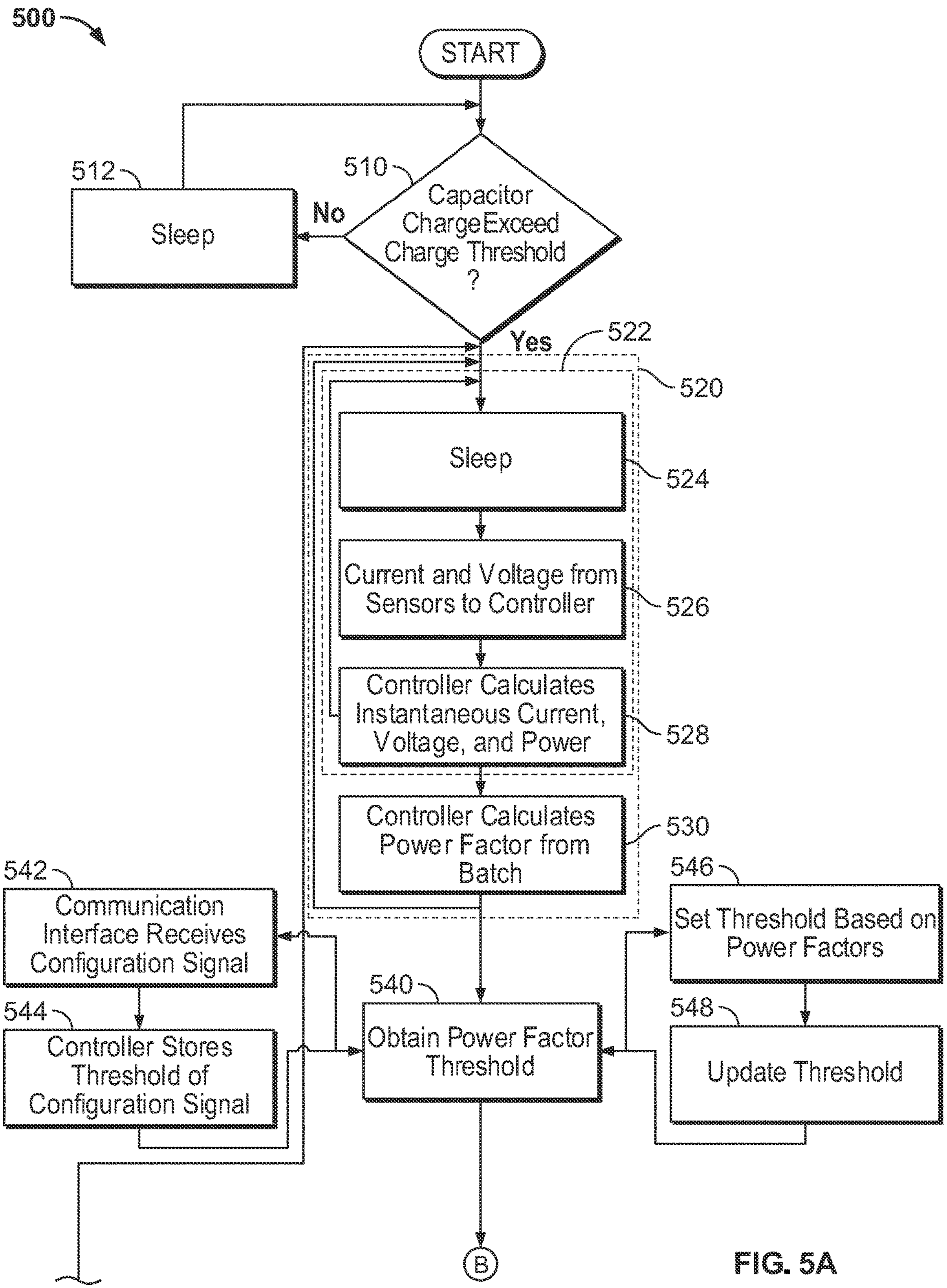
FIGS. 5A and 5B are a flowchart of a process of determining an operating state of a powered device of the sensor assembly.
Figure 5B:
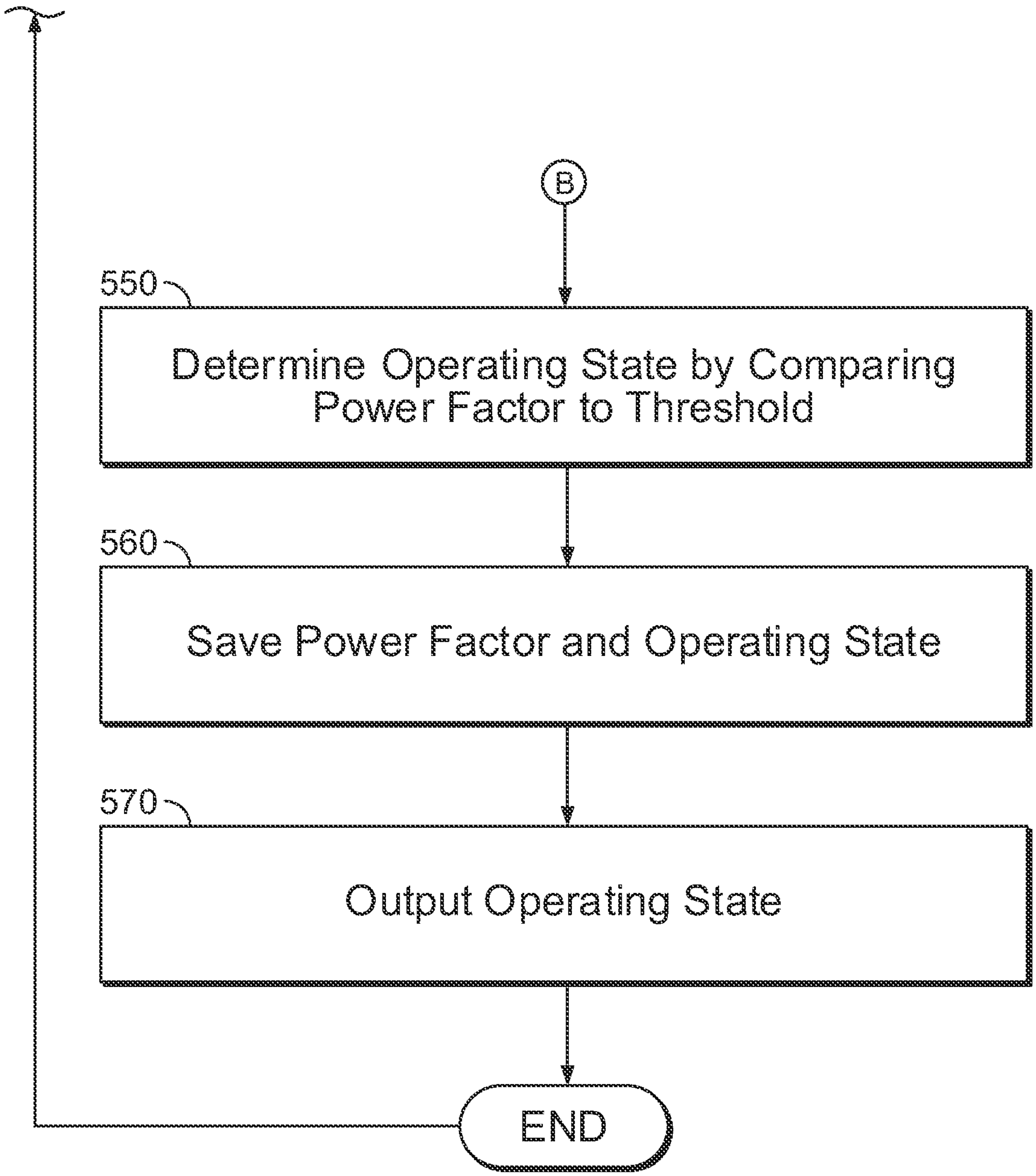

A process 500 of using the power meter 100 to determine qualities of the conductor signal 300, and to determine and output an operating state of the powered device 400 from the determined qualities of the conductor signal 300, is shown in FIGS. 5A and 5B.

The power meter 100 begins in a harvesting mode in which, as the core 142 and the coil 146 of the current sensor 140 inductively draw a current from the wire 200, the current in the current signal 148 transmitted from the current sensor 140 is stored in the capacitor 180. The power meter 100 remains in the harvesting mode in a step 510 shown in FIG. 5A until a capacitor charge in the capacitor 180 exceeds a charge threshold. As shown in FIG. 5A, if the capacitor charge does not exceed the charge threshold, the controller 170 sleeps in a step 512 for a predetermined period before looping back and again comparing the capacitor charge to the charge threshold. In an embodiment, the charge threshold is 7.38V and the controller 170 sleeps for approximately 250 ms in the step 512. This charge threshold and the sleep duration are merely exemplary and any other threshold or time quantity could be used based on the application.

In the harvesting mode of step 510, the controller 170 does not receive and analyze the current signal 148 from the current sensor 140 or a voltage signal 152 from the voltage sensor 150. In an embodiment, the charge threshold described above is an upper charge threshold and a lower charge threshold is also analyzed. In this embodiment, the controller 170 does not turn on in the harvesting mode until the lower threshold is exceeded by the capacitor charge in the capacitor 180. In an exemplary embodiment, the lower charge threshold is approximately 6.4 V.

In the step 150, once the controller 170 determines that the capacitor charge in the capacitor 180 exceeds the charge threshold, the controller 170 switches from the harvesting mode into a measurement mode and proceeds to a batch loop 520. The controller 170 switches from the harvesting mode to the measurement mode by engaging a shunt or otherwise switching the current signal 148 from being used to charge the capacitor 180 to being received at the controller 170. The controller 170 determines the operating state of the powered device 400 in the measurement mode as described below.

In the batch loop 520, the controller 170 first executes a sample loop 522 for a plurality of cycles. Each sample loop 522 begins with a step 524 in which the controller 170 sleeps for a brief predetermined period, such as 5 μs. Then, in a step 526, the current sensor 140 senses a current of the conductor signal 300 and outputs the current signal 148 to the controller 170 indicative of the current of the conductor signal 300. In the step 526, the voltage sensor 150 also senses a voltage of the conductor signal 300 and outputs the voltage signal 152 to the controller 170, which indicates the voltage of the conductor signal 300.

In a step 528 of the sample loop 522 shown in FIG. 5A, based on the current signal 148 received from the current sensor 140 and the voltage signal 152 received from the voltage sensor 150, the controller 170 determines a power of the conductor signal 300. In an embodiment, the controller 170 uses a high pass filter to remove low frequency transients from the current signal 148 and uses a circular queue to delay the voltage signals 152 to compensate for a hardware phase shift. The processor 172 executes a plurality of algorithms stored in the memory 174 to calculate a sample current from the current signal 148, a sample voltage from the voltage signal 152, and a sample power of the conductor signal 300 according to the following equations:

$$I_{SAMP} = I_{HPF} * I_{HPF} \quad \text{(Eqn. 1)}$$

$$V_{SAMP} = V_S * V_S \quad \text{(Eqn. 2)}$$

$$P_{SAMP} = I_{HPF} * V_{DELAY} \quad \text{(Eqn. 3)}$$

where $I_{SAMP}$ is the calculated square current of the conductor signal 300 in the sample, $I_{HPF}$ is the current of the current signal 148 passed through a high pass filter, $V_{SAMP}$ is the calculated square voltage of the conductor signal 300 in the sample, $V_S$ is the voltage of the voltage signal 152, $P_{SAMP}$ is the calculated power of the conductor signal 300 in the sample, and $V_{DELAY}$ is the voltage of the voltage signal 152 delayed to compensate for the hardware phase shift.

The sample loop 522 is then repeated for the plurality of cycles through the steps 524, 526, and 528. In an embodiment, the sample loop 522 is repeated for 256 cycles, but the number of cycles could be any number depending on the application.

When the sample loop 522 has run for the predetermined number of cycles, in a step 530 shown in FIG. 5A that is the last step of the batch loop 520, the controller 170 calculates a root mean square current of the current signal 148 for the batch, a root mean square voltage of the voltage signal 152 for the batch, a root mean square power of the conductor signal 300 for the batch, and a power factor of the conductor signal 300 for the batch according to the following equations:

$$I_{RMS} = \sqrt{[(\sum I_{SAMP})/(\#\text{ of cycles})]} \quad \text{(Eqn. 4)}$$

$$V_{RMS} = \sqrt{[(\sum V_{SAMP})/(\#\text{ of cycles})]} \quad \text{(Eqn. 5)}$$

$$P_{RMS} = (\sum P_{SAMP})/(\#\text{ of cycles}) \quad \text{(Eqn. 6)}$$

$$\text{Power Factor} = P_{RMS}/(V_{RMS} * I_{RMS}) \quad \text{(Eqn. 7)}$$

where $I_{RMS}$ is the root mean square current of the current signal 148 for the batch, $V_{RMS}$ is the root mean square voltage of the voltage signal 152 for the batch, and $P_{RMS}$ is the root mean square power of the conductor signal 300 for the batch. The batch includes the plurality of samples taken across the number of cycles in the batch; each of the root mean square current, the root mean square voltage, and the root mean square power obtain an average of the values for each sample in Equations 1-3 by summing the values from Equations 1-3 over the whole batch and dividing by the number of cycles in the batch. The root mean square current and the root mean square voltage further take the square root of this average.

In the step 530, based on Equation 7 above, the controller 170 determines the power factor of the conductor signal 300 for the batch that includes the plurality of samples obtained in the sample loops 522. The controller 170 can then repeat the batch loop 520 a predetermined number of times to obtain the power factors of the conductor signal 300 in the step 530 in a plurality of batches over time.

In a step 540 shown in FIG. 5A, the controller 170 obtains a power factor threshold. In an embodiment, the power factor threshold is a threshold 176 stored in advance in the memory 174.

In another embodiment, as shown in steps 542 and 544 of FIG. 5A, the communication interface 160 can be connected to a computing device 450 as shown in FIG. 4. The computing device 450, such as a mobile device or a laptop of a user, can transmit a configuration signal 162 to the communication interface 160. The configuration signal 162 indicates the threshold 176 of the power factor. The communication interface 160 receives the configuration signal 162 from the computing device 450 in the step 542 and, after transmitting the configuration signal 162 to the controller 170, the controller 170 stores the threshold 176 of the power factor received from the configuration signal 162 in the memory 176 in a step 544.

In another embodiment, shown in steps 546 and 548 of FIG. 5A, the controller 170 can execute a threshold determination algorithm 178 stored in the memory 174 to automatically set the power factor threshold 176 based on the data gathered and calculated in the batch loops 520. In the step 546, the controller 170 sets the power factor threshold 176 according to the following equation:

$$\text{Threshold}_{PF} = (\sum \text{Power Factors})/(\#\text{ of batches})] + C \quad \text{(Eqn. 8)}$$

where $\text{Threshold}_{PF}$ is the power factor threshold 176 and C is a constant. The power factor threshold 176 is thus calculated by the controller 170 as an average of the power factors calculated in step 530 of a number of batches in consecutive batch loops 520 plus the constant C that is predetermined. In an embodiment, the controller 170 waits for the calculation of the power factor for four batches to determine the average and the threshold power factor, but in other embodiments the controller 170 could wait for a smaller or larger number of batches. In an embodiment, the constant C is 0.04. In other embodiments, the constant C can be any value that reliably differentiates the states of the powered device 400 in the application. The controller 170 can store the power factor threshold 176 determined in step 546 in the memory 174.

The determination of the power factor threshold 176 in step 546 depends on the operating state of the powered device 400 being in an off state during the measurements of the batches in the batch loops 520. If the operating state of the powered device 400 is not in the off state during the setting of the power factor threshold 176 in step 546, then calculations of the power factor in step 530 in subsequent batches will be less than the set threshold 176. In a step 548, if the power factor calculated in step 530 for a plurality of consecutive batches is less than the current threshold 176, then the power factor threshold 176 is re-calculated in Equation 8 using the average power factor of the new batches and updated in the memory 174. In an embodiment, the number of consecutive batches with a lower power factor than the current threshold required to trigger an update of the threshold 176 is eight, but could be any number that reliably resets the threshold 176.

In a step 550 shown in FIG. 5B, the controller 170 compares the power factors of the batch loops 520 calculated in step 530 to the power factor threshold 176 to determine the operating state of the powered device 400. If the power factors in a plurality of consecutive batch loops 520 are greater than the power factor threshold 176, the controller 170 determines that the powered device 400 is in an on state. If the power factors in the plurality of consecutive batch loops 520 are less than the power factor threshold 176, the controller 170 determines that the powered device 400 is in the off state. In an embodiment, the number of the plurality of consecutive batch loops 520 with calculated power factors used to determine the operating state of the powered device 400 in step 550 is three. In other embodiments, the number of the plurality of consecutive batch loops 520 with calculated power factors could be two or more than three.

In a step 560 shown in FIG. 5B, the controller 170 saves the power factors from the batch loops 520 to the memory 174 and saves the determined operating state of the powered device 400.

The operating state of the powered device 400 determined in step 550 is output by the controller 170 in a step 570 shown in FIG. 5B. When the controller 170 outputs the determined operating state according to the embodiments described below, the process 500 can loop back to the beginning of the measurement mode and being calculating the power factors for a plurality of additional batch loops 520.

In an embodiment, the controller 170 sends the determined operating state to the external connection device 190, which outputs an output signal 192, for example along the external wire 196, that represents the operating state of the powered device 400. The output signal 192 indicates whether the powered device 400 is in an on state or an off state. The output signal 192 can be an analog signal or a digital signal according to any of the protocols of the external connection device 190 described above.

In another embodiment, in the step 570, the controller 170 controls the indicators 194 to represent the operating state of the powered device 400. For example, the controller 170 controls one of the indicators 194 to indicate a first color in the on state, and controls another of the indicators 194 to indicate a second color in the off state. The indicators 194 can be embodied by a plurality of different structures controllable by the controller 170 that can indicate the operating status of the powered device 400 at the exterior of the housing 110.

In another embodiment, in the step 570, upon receiving a prompt from the computing device 450 via the communication interface 160, the controller 170 can output a data signal 164 to the computing device 450 via the communication interface 160; the data signal 164 indicates at least one of the power of the conductor signal 300, the current of the conductor signal 300, the voltage of the conductor signal 300, and the calculated power factor of the conductor signal 300 over a plurality of batches. The controller 170 can also output in the data signal 164 the operating state of the powered device 400.

Figure 6:
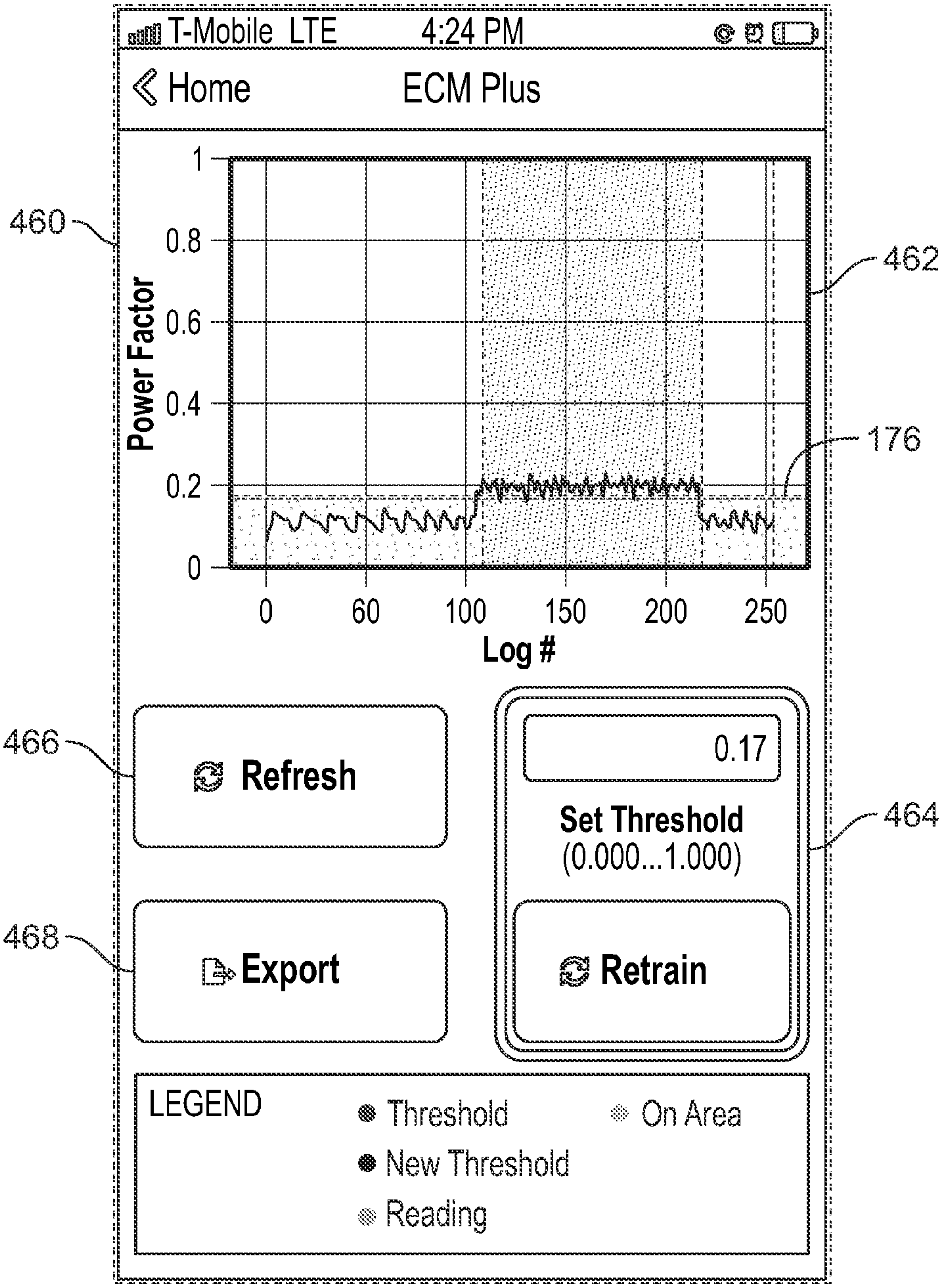
FIG. 6 is a schematic depiction of a graphical user interface on a display of a computing device of the sensor assembly.

As shown in FIG. 6, the computing device 450 can display the data received from the controller 170 of the power meter 100 in a graphical user interface on a display 460. In the exemplary embodiment shown, the power factor over time can be displayed in a graph with the power factor threshold 176 indicated. A threshold button 464 of the graphical user interface can be used to set the power factor threshold 176 as described in steps 542 and 544 above. The graphical user interface also has buttons to refresh 466 the data gathered from the power meter 100 and export 468 the data gathered from the power meter 100. Other functions are also possible.

By determining the operating state of the powered device 400 with a calculated power factor of the conductor signal 300, the sensor assembly 10 and the power meter 100 of the invention can more accurately differentiate the on and off operating states of the powered device 400. Further, via the communication interface 160 or by the controller 170 itself, the power factor threshold 176 used to determine the operating state of the powered device 400 is customizable and automatically adjustable to a variety of application conditions.

What is claimed is:

1. A power meter, comprising:

a housing releasably positioned around a wire;

a current sensor disposed in the housing and sensing a current of a conductor signal transmitted along a conductor of the wire and outputting a current signal based on the current;

a voltage sensor disposed in the housing and sensing a voltage of the conductor signal and outputting a voltage signal based on the voltage; and a controller disposed in the housing, the controller receiving the current signal and the voltage signal and calculating a power factor of the conductor signal based on the current signal and the voltage signal, the controller determines an operating state of a powered device to which the conductor feeds the conductor signal based on the power factor, the controller compares the power factor to a threshold to determine the operating state of the powered device, the operating state of the powered device determined by the controller is an on state or an off state, and the threshold is less than 0.2.

2. The power meter of claim 1, further comprising a communication interface connected to the controller, the communication interface receives a configuration signal from a computing device setting the threshold.

3. The power meter of claim 1, wherein the controller executes a threshold determination algorithm to determine the threshold based on the voltage signal and the current signal when the operating state of the powered device is the off state.

4. The power meter of claim 1, wherein the current sensor has a core and a coil disposed around the core, and further comprising a capacitor connected to the current sensor and the controller.

5. The power meter of claim 4, wherein the conductor extends through the core of the current sensor.

6. The power meter of claim 4, wherein the controller has a harvesting mode and a measurement mode, the controller determines the operating state of the powered device in the measurement mode, and the capacitor is inductively charged by the core and the coil in the harvesting mode.

7. The power meter of claim 6, wherein the controller switches from the harvesting mode to the measurement mode when a capacitor charge of the capacitor exceeds a charge threshold.

8. The power meter of claim 1, wherein the controller receives a plurality of readings of each of the voltage signal and the current signal in a batch and calculates the power factor for the batch.

9. The power meter of claim 8, wherein the controller determines the operating state of the powered device based on a comparison of a predetermined plurality of consecutive calculations of the power factor to the threshold.

10. The power meter of claim 1, further comprising a communication interface connected to the controller, the controller outputs the operating state of the powered device to the computing device via the communication interface.

11. The power meter of claim 1, further comprising an external connection device connected to the controller, the controller outputs the operating state of the powered device as an output signal at the external connection device, the output signal is an analog signal or a digital signal.

12. The power meter of claim 1, further comprising a plurality of indicators connected to the controller, the controller controls the indicators to represent the operating state of the powered device.

13. The power meter of claim 1, wherein the powered device is an electronically commutated motor.

14. A method of determining an operating state of a powered device, comprising:

providing a power meter having a housing, a current sensor disposed in the housing, a voltage sensor disposed in the housing, and a controller disposed in the housing and connected to the current sensor and the voltage sensor;

releasably positioning the housing around a wire having a conductor;

sensing a voltage of a conductor signal transmitted along the conductor to the powered device with the voltage sensor and outputting a voltage signal based on the voltage to the controller;

sensing a current of the conductor signal with the current sensor and outputting a current signal based on the current to the controller;

calculating a power factor of the conductor signal with the controller based on the current signal and the voltage signal; and determining an operating state of the powered device with the controller based on the power factor, the controller compares the power factor to a threshold to determine the operating state of the powered device, the operating state of the powered device determined by the controller is an on state or an off state, and the threshold is less than 0.2.

15. The method of claim 14, wherein the controller receives a plurality of readings of each of the voltage signal and the current signal in a batch and calculates the power factor for the batch.

16. The method of claim 15, wherein the controller calculates a root mean square of the current signal, a root mean square of the voltage signal, and a root mean square of a power of the conductor signal in the batch, and the power factor of the batch is calculated based on the root mean square of the current signal, the root mean square of the voltage signal, and the root mean square of the power.

17. The method of claim 15, wherein the controller determines the threshold based on the power factor calculated for a plurality of batches when the operating state of the powered device is the off state.

18. The method of claim 17, wherein the threshold is calculated based on an average of the power factor of the plurality of batches added to a constant value.

19. The method of claim 17, wherein the controller updates the threshold if the power factor calculated for the plurality of batches is less than the current threshold.

* * * * *